United States Patent
Thasari et al.

(10) Patent No.: US 10,187,080 B1
(45) Date of Patent: Jan. 22, 2019

(54) APPARATUS AND SYSTEM FOR HIGH SPEED KEEPER BASED SWITCH DRIVER

(71) Applicant: AVAGO TECHNOLOGIES INTERNATIONAL SALES PTE. LIMITED

(72) Inventors: Kumar Thasari, Irvine, CA (US); Ullas Singh, Irvine, CA (US); Arvindh Iyer, Irvine, CA (US); Namik Kocaman, San Clemente, CA (US)

(73) Assignee: AVAGO TECHNOLOGIES INTERNATIONAL SALES PTE. LIMITED, Singapore (SG)

( * ) Notice: Subject to any disclaimer, the term of this patent is extended or adjusted under 35 U.S.C. 154(b) by 0 days.

(21) Appl. No.: 15/963,608

(22) Filed: Apr. 26, 2018

(51) Int. Cl.
*H03M 1/74* (2006.01)

(52) U.S. Cl.
CPC .............. *H03M 1/74* (2013.01); *H03M 1/742* (2013.01); *H03M 1/747* (2013.01)

(58) Field of Classification Search
CPC ......... H03M 1/74; H03M 1/742; H03M 7/747
USPC ........................................ 341/135, 136, 144
See application file for complete search history.

(56) References Cited

U.S. PATENT DOCUMENTS

| | | | |
|---|---|---|---|
| 6,768,438 B1 * | 7/2004 | Schofield .............. | H03M 1/068 341/144 |
| 6,836,234 B1 * | 12/2004 | Wang ............... | H03K 17/04123 341/136 |
| 6,842,132 B2 * | 1/2005 | Schafferer ............. | H03M 1/068 341/136 |
| 7,064,695 B2 * | 6/2006 | Koo ................. | H03K 17/04106 341/136 |

* cited by examiner

Primary Examiner — Khai M Nguyen
(74) Attorney, Agent, or Firm — Xsensus/Broadcom

(57) ABSTRACT

A keeper based switch driver can generate overlapping differential signals and increase a crossing point of the overlapping differential signals a first predetermined amount. Additionally, the keeper based switch driver can further increase the crossing point of the overlapping differential signals a second predetermined amount and limit signal swing to an absolute value of a drain-source voltage. A microprocessor can also be electrically connected to a DAC cell with keeper based switch driver through a performance detection circuit. The microprocessor can be configured to receive information from a performance detection circuit and control a current of a variable current source in a keeper bias circuit accordingly.

20 Claims, 4 Drawing Sheets

APPARATUS AND SYSTEM FOR HIGH SPEED KEEPER BASED SWITCH DRIVER

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

Complimentary metal-oxide-semiconductor (CMOS) to current mode logic (CIVIL) interfaces are common. For example, CMOS to CIVIL interfaces can be used in digital-to-analog converters (DAC), decision feedback equalizers (DFE), and the like. The CMOS domain of the interface offers low power, but has limited speed. Accordingly, at some point in the circuit, structure switches from the low power CMOS domain to the faster CIVIL domain of the interface in order to accommodate higher speed switching requirements. However, the faster switching speeds of the CML domain comes at the expense of greater power consumption. Therefore, improvements to the CMOS to CML interfaces are desired to increase performance while minimizing increases in power consumption.

SUMMARY

The foregoing paragraphs have been provided by way of general introduction, and are not intended to limit the scope of the following claims. The described embodiments, together with further advantages, will be best understood by reference to the following detailed description taken in conjunction with the accompanying drawings.

According to aspects of the disclosed subject matter, a keeper based switch driver can generate overlapping differential signals and increase a crossing point of the overlapping differential signals a first predetermined amount due to a skewed inverter pre-driver. Additionally, the keeper based switch driver can further increase the crossing point of the overlapping differential signals a second predetermined amount due to a keeper/pull up device, and limit signal swing to an absolute value of a drain-source voltage. A microprocessor can be electrically connected to a performance detection circuit. The microprocessor can be configured to receive information from the performance detection circuit and control a current of a variable current source in a keeper bias circuit accordingly.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

The description set forth below in connection with the appended drawings is intended as a description of various embodiments of the disclosed subject matter and is not necessarily intended to represent the only embodiment(s). In certain instances, the description includes specific details for the purpose of providing an understanding of the disclosed subject matter. However, it will be apparent to those skilled in the art that embodiments may be practiced without these specific details. In some instances, well-known structures and components may be shown in block diagram form in order to avoid obscuring the concepts of the disclosed subject matter.

Reference throughout the specification to "one embodiment" or "an embodiment" means that a particular feature, structure, characteristic, operation, or function described in connection with an embodiment is included in at least one embodiment of the disclosed subject matter. Thus, any appearance of the phrases "in one embodiment" or "in an embodiment" in the specification is not necessarily referring to the same embodiment. Further, the particular features, structures, characteristics, operations, or functions may be combined in any suitable manner in one or more embodiments. Further, it is intended that embodiments of the disclosed subject matter can, and do, cover modifications and variations of the described embodiments.

It must be noted that, as used in the specification and the appended claims, the singular forms "a," "an," and "the" include plural referents unless the context clearly dictates otherwise. That is, unless clearly specified otherwise, as used herein the words "a" and "an" and the like carry the meaning of "one or more." Furthermore, terms such as "first," "second," "third," etc., merely identify one of a number of portions, components, points of reference, operations and/or functions as described herein, and likewise do not necessarily limit embodiments of the disclosed subject matter to any particular configuration or orientation.

Figure 1:
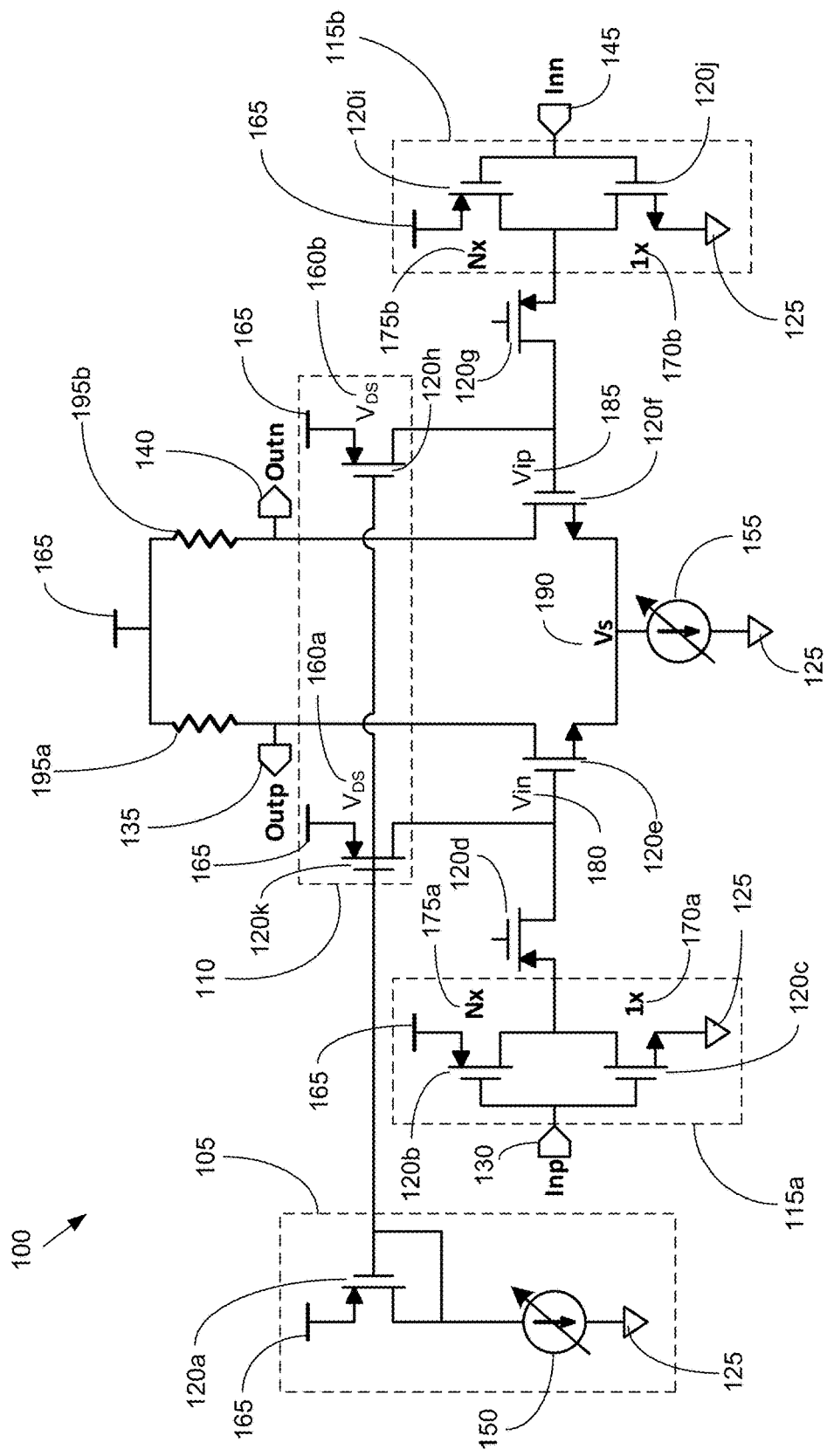
FIG. 1 illustrates an overview of a digital to analog converter (DAC) cell with a keeper based switch driver according to one or more exemplary aspects of the disclosed subject matter.

Referring now to the drawings, wherein like reference numerals designate identical or corresponding parts throughout the several views, FIG. 1 illustrates an overview of a DAC cell with keeper based switch driver 100 according to one or more exemplary aspects of the disclosed subject matter. It should be appreciated that in one implementation a DFE Tap cell can be used with the keeper based switch driver. Generally, the keeper based switch driver 100 includes a keeper bias circuit 105, a keeper cell 110, a first skewed inverter pre-driver 115a, and a second skewed inverter pre-driver 115b, and transistors (i.e., switches) 120d, 120g. The keeper based switch driver 100 reduces DAC switching non-idealities by using a switching driver, which generates overlapping differential signals. More specifically, the skewed inverter pre-drivers 115a, 115b each include p-channel metal-oxide semiconductor (PMOS) transistors of different sizes compared to the n-channel metal-oxide semiconductor (NMOS) transistors in order to increase the common mode (CM) crossing point without introducing additional delay, thereby generating overlapping differential signals. For example, and as is explained in greater detail below, the skewed inverter pre-driver 115a includes a PMOS transistor 120*b* that is N times larger than its NMOS transistor 120*c*. The keeper cell 110 serves as a pull up device, which helps accelerate the switching of the device and increase the CM crossing point and enabling optimal biasing for the DAC as a result.

The keeper bias circuit 105 can include a ground 125 connected to a variable current source 150, and a transistor 120*a* connected to the variable current source 150. The keeper cell 110 can include transistors 120*h*, 120*k*. Additionally, $V_{DS}$ 160*a* and $V_{DS}$ 160*b* indicate a drain-source voltage at the transistor 120*k* and 120*h*, respectively. The keeper cell 110 can serve as a pull up device and increase the CM crossing point, thereby enabling optimal biasing for the DAC cell. In one implementation, the transistors 120*k*, 120*h* in the keeper cell 110 can be passive resistors.

The skewed inverter pre-driver 115*a* can be connected to a positive input terminal 130. The skewed inverter pre-driver 115*a* can include transistors 120*b*, 120*c*. Transistor 120*b* can be connected to a positive supply 165, and transistor 120*c* can be connected to the ground 125. Notation "1×" 170*a* corresponding to transistor 120*c* and notation "N×" 175*a* corresponding to transistor 120*b* indicates a physical size of the skewed inverter pre-driver 115*a*. In other words, "N×" 175*a* (i.e., transistor 120*b*) indicates that the device is "N" times bigger than "1×" 170*a* (i.e., transistor 120*c*). More specifically, the PMOS device is "N" times larger than the NMOS device. In one implementation, N is greater than 1.

Additionally, transistor 120*d* can be positioned between the skewed inverter pre-driver 115*a* and transistor 120*e* corresponding to a negative voltage input (Vin) 180. The transistor 120*d* can be a switch configured to enable/disable the DAC cell. Accordingly, the transistor 120*d* can assist in isolating the DAC cell input from the CMOS input from the skewed inverter pre-driver 115*a*.

The skewed inverter pre-driver 115*b* can be connected to a negative input terminal 145. The skewed inverter pre-driver 115*b* can be symmetrical to the skewed inverter pre-driver 115*a*. The skewed inverter pre-driver 115*b* can include transistors 120*i*, 120*j*. Transistor 120*i* can be connected to the positive supply 165, and transistor 120*j* can be connected to the ground 125. Notation "1×" 170*b* corresponding to transistor 120*j* and notation "N×" 175*b* corresponding to transistor 120*i* indicates a physical size of the skewed inverter pre-driver 115*b*. In other words, "N×" 175*b* (i.e., transistor 120*i*) indicates that the device is "N" times bigger than "1×" 170*b* (i.e., transistor 120*j*). More specifically, the PMOS device is "N" times larger than the NMOS device. In one implementation, N is greater than 1. Additionally, transistor 120*g* can be positioned between the skewed inverter pre-driver 115*b* and transistor 120*f* corresponding to a positive voltage input (Vip) 185. The transistor 120*g* can be a switch configured to enable/disable the DAC cell. Accordingly, the transistor 120*g* can assist in isolating the DAC cell input from the CMOS input from the skewed inverter pre-driver 115*b*.

The skewed inverter pre-driver 115*a*, 115*b* and the keeper cell 110 complement each other. For example, excess skewing using the skewed inverter pre-driver 115*a*, 115*b* alone increases previous stage loading and increases delay. However, the skewed inverter pre-driver 115*a*, 115*b* combined with the keeper cell 110 reduces input signal swing, thereby reducing delay.

The DAC cell with keeper based switch driver 100 can also include a variable current source 155 connected to the ground 125. Additionally, a source voltage is indicated by source voltage (Vs) 190. The DAC cell with keeper based switch driver 100 can also include a positive output terminal 135, a negative output terminal 140, loads 195*a*, 195*b* (e.g., resistor, MOS device, etc.), and the positive supply 165. Though FIG. 1 illustrates a positive supply 165, the circuit may be constructed to work with a negative supply, such as when the PMOS and NMOS devices are reversed as would be known by a person of ordinary skill in the art.

An advantage of the DAC cell with keeper based switch driver 100 is the CM increase, which can be increased by more than 200 mV (0.27*VDD increase), for example, as further described herein, where VDD is the supply voltage (e.g., supply voltage 165). The significant increase is based on the skewed inverter pre-drivers 115*a*, 115*b* raising the crossing point of the differential inputs Vip 185 and the Vin 180. The increase of the crossing point from the skewed inverter pre-drivers 115*a*, 115*b* can be further increased by the keeper cell 110 because the keeper cell 110 can serve as a pull up device.

Figure 2:
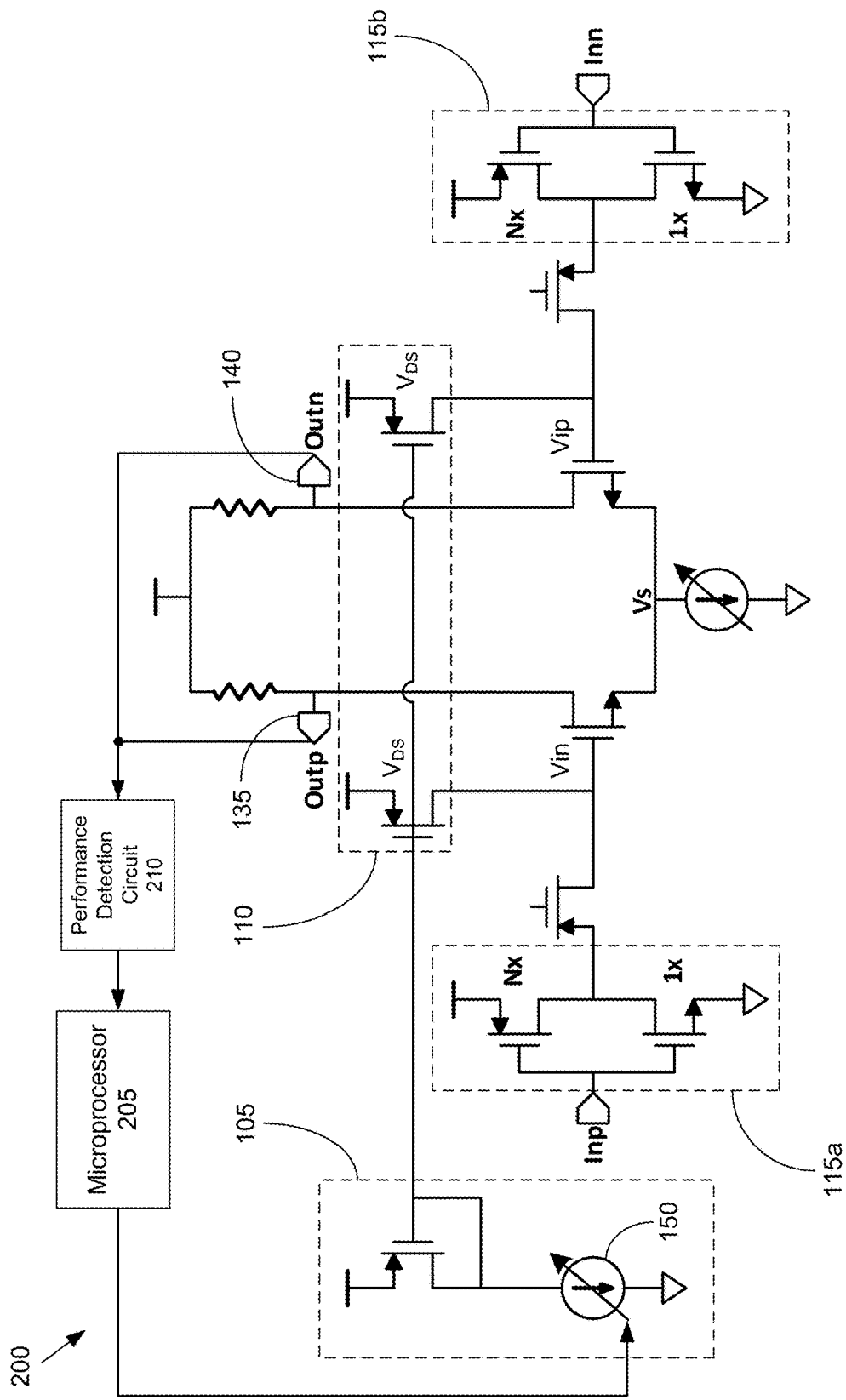
FIG. 2 illustrates a dynamic keeper based switch driver according to one or more exemplary aspects of the disclosed subject matter.

FIG. 2 illustrates a DAC cell with dynamic keeper based switch driver 200 according to one or more exemplary aspects of the disclosed subject matter. The structure and components of the dynamic keeper based switch driver 200 is the same as the keeper based switch driver 100 except where otherwise indicated. For example, the DAC cell with dynamic keeper based switch driver 200 can include a microprocessor 205 and a performance detection circuit 210. The performance detection circuit 210 can be connected to the positive output terminal 135 and the negative output terminal 140 of the DAC cell such that the performance detection circuit 210 includes processing circuitry configured to receive output information from the positive and negative output terminals 135, 140. The performance detection circuit 210 can also include a slicer/ADC. Further, the performance detection circuit 210 can be connected to the microprocessor 205 and output from the performance detection circuit 210 can be fed to the microprocessor 205. The microprocessor 205 can monitor the DAC cell performance parameters and control the keeper bias current 150. The loop can converge to the lowest keeper bias current 150 that meets the specified parameters. This can be a one-time or continuous calibration loop to adjust the keeper current based on circuit conditions like temperature, etc.

The microprocessor 205 can include a CPU including processing circuitry configured to carry out instructions to perform or cause performance of various functions, operations, steps or processes of the dynamic keeper based switch driver 200. For example, the microprocessor 205 can be configured to store information in memory, receive signals from the positive output terminal 135 and the negative output terminal 140, control the current at the variable current source 150 based on the received signals from the positive and negative output terminals 135, 140, and the like.

Figures 3, 4:
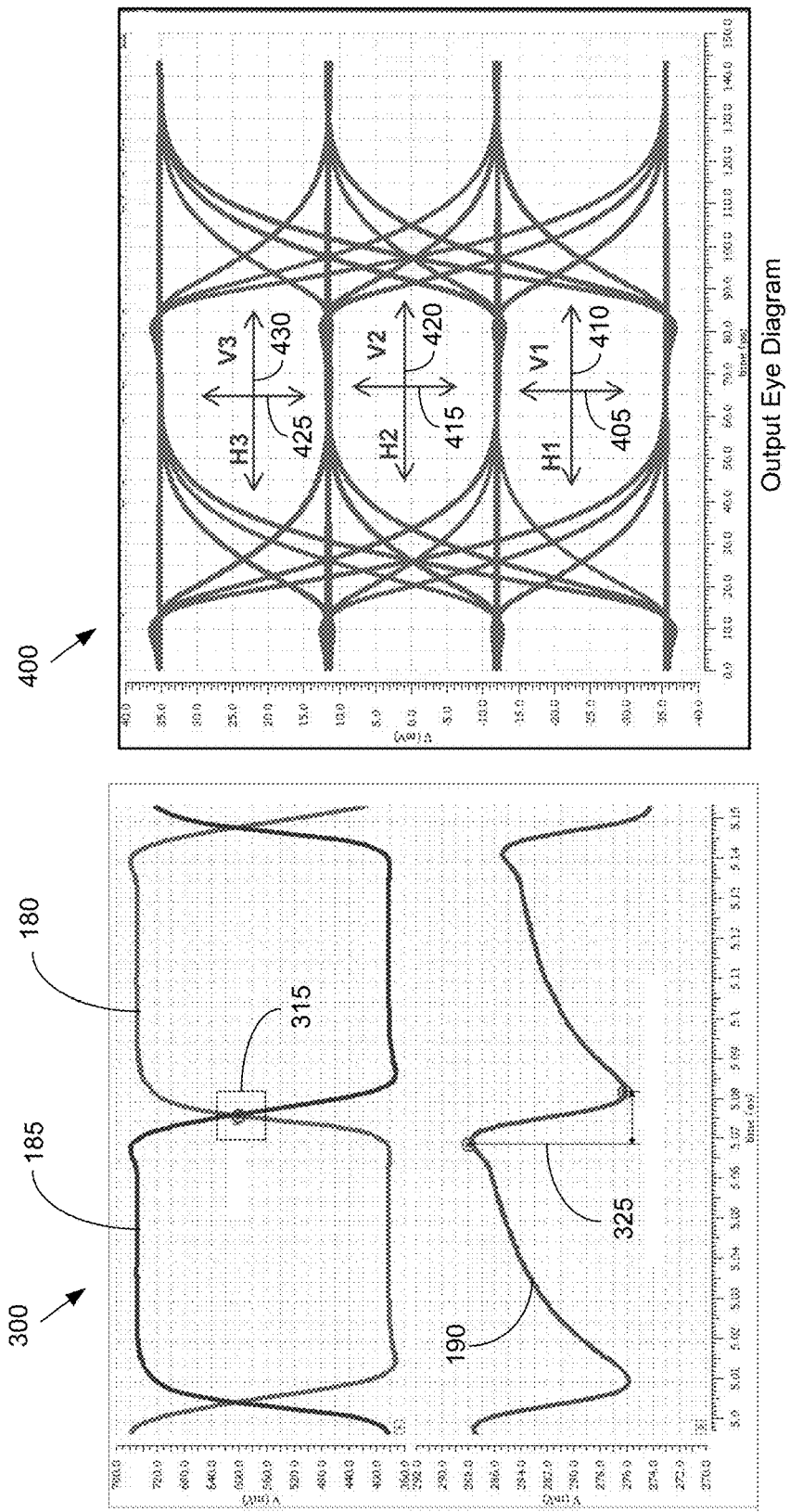
FIG. 3 illustrates an exemplary graph displaying a common mode and corresponding transient source voltage according to one or more aspects of the disclosed subject matter.
FIG. 4 illustrates an exemplary graph displaying a Pulse Amplitude Modulation (PAM) 4 eye diagram according to one or more aspects of the disclosed subject matter.

FIG. 3 illustrates an exemplary graph 300 displaying a graphical representation of a common mode and corresponding transient source voltage according to one or more aspects of the disclosed subject matter. An x-axis of the graph 300 is time in nanoseconds and a y-axis of the graph 300 is voltage in millivolts. The graph 300 includes differential inputs Vin 180 and Vip 185. In one implementation, the differential inputs Vin 180 and Vip 185 cross at around 600 mV (0.8VDD) which corresponds to the common mode 315. CMOS signals have a crossing point around 0.5VDD, and the keeper cell 110 increases the crossing point to 0.8VDD (in addition to the increase provided by the skewed inverter pre-drivers 115*a*, 115*b*), thereby enabling optimal biasing for the DAC cell. More specifically, the low side of the input signal can be determined by the $V_{DS}$ 160*a*, 160*b* of the keeper cell 110. As a result, the CMOS swing can be limited to $|V_{DS}|$ of the keeper cell 110. The lower swing can reduce delay and contribute to faster switching with improved rise and fall times. Additionally, the keeper cell 100 can be programmable to have a constant current consumption across process, voltage, and temperature (PVT).

The graph 300 also includes a graphical representation of Vs 190. The x-axis of the graph 300 is time in nanoseconds and a y-axis of the graph 300 is voltage in millivolts such that the transient Vs 190 can be compared to the differential inputs Vin 180 and Vip 185 over time. For example, the crossing point of the differential inputs (e.g., common mode 315) can correspond to a source node fluctuation 325 of around 12 mV (65% reduction in Vs with this scheme). The source voltage (Vs) 190 can correspond to the voltage of the source node, for example. Traditional differential-pair source voltage 190 has dips/downward fluctuations at the input crossing points. As a result, the differential-pair current can have large fluctuations if the impedance of the bias current source is finite. This can cause overshoots in the output waveform and degrade settling time. However, the keeper-based switch driver increases the input common-mode at the switching instant, thereby reducing the source-node fluctuations and improving output eye quality, as seen in FIG. 4.

FIG. 4 illustrates an exemplary graph displaying a four-level pulsed amplitude modulation (PAM4) eye diagram 400 according to one or more aspects of the disclosed subject matter. In one implementation, the PAM4 eye diagram 400 is a 14 Gbps PAM4 eye diagram. The x-axis of the graph can be time in picoseconds (ps), and the y-axis of the graph can be voltage in millivolts (mV). The PAM4 eye diagram 400 includes three eyes, each measured based on a vertical and horizontal opening of the eye. For example, a first eye of the PAM4 eye diagram 400 can include a vertical opening V1 405 and a horizontal opening H1 410. The second and third eye can have vertical and horizontal openings V2 415, H2 420, V3 425, and H3 430, respectively. The vertical eye openings can be measured in millivolts (mV) and the horizontal eye openings can be measured in picoseconds (ps). The eye openings in the PAM4 eye diagram 400 illustrate significant improvements in both vertical and horizontal measurements. For example, a worst case horizontal measurement can be at least a 13.5% improvement by increasing the horizontal measurement by around seven picoseconds. Additionally, a worst case vertical measurement can be at least a 31.5% improvement. The improved PAM4 eye openings due to the reduced input swing can correspond to around a 2.75 picosecond or 14% tap delay reduction.

Figure 5:
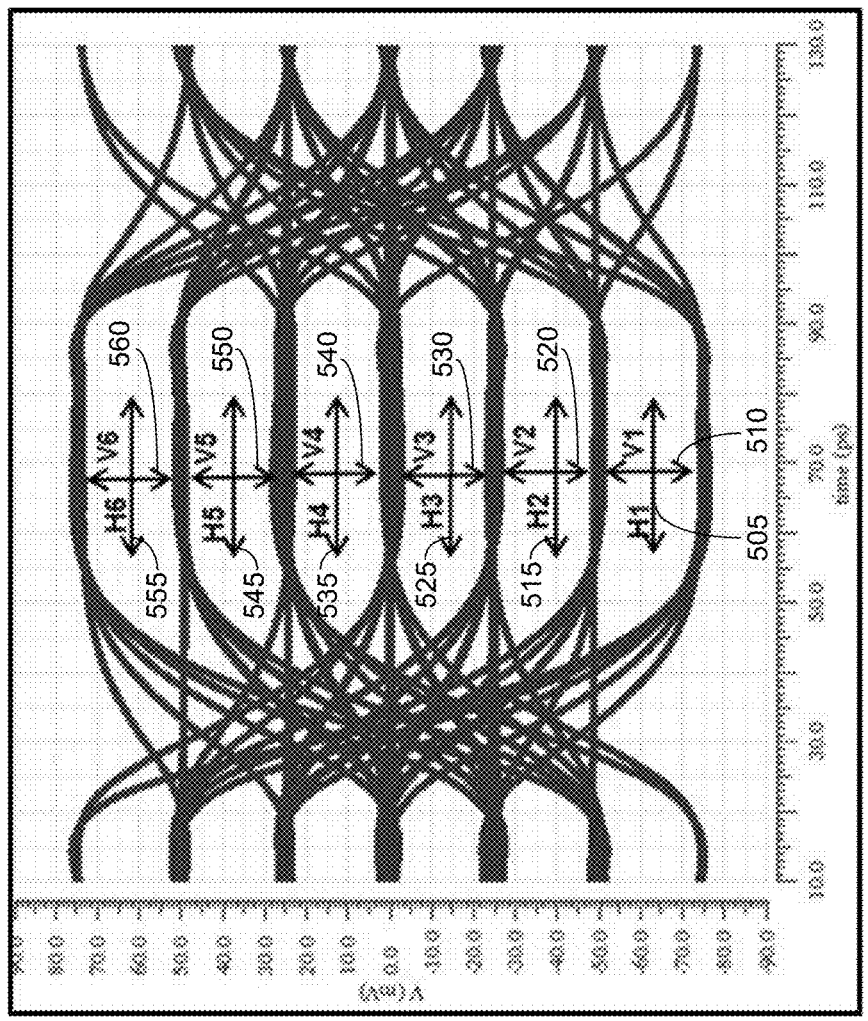
FIG. 5 illustrates an exemplary graph displaying a PAM7 eye diagram according to one or more exemplary aspects of the disclosed subject matter.

FIG. 5 illustrates an exemplary graph displaying a PAM7 eye diagram 500 according to one or more exemplary aspects of the disclosed subject matter. The x-axis of the graph can be time in picoseconds (ps), and the y-axis of the graph can be voltage in millivolts (mV). The seven-level pulsed amplitude modulation (PAM7) eye diagram 500 includes six eyes, each measured based on a vertical and horizontal opening of the eye. For example, a first eye of the PAM7 eye diagram 500 can include a horizontal opening H1 505 and a vertical opening V1 510. The second, third, fourth, fifth, and sixth eye can have horizontal and vertical openings H2 515, V2 520, H3 525, V3 530, H4 535, V4 540, H5 545, V5 550, H6 555, V6 560, respectively. The vertical eye openings can be measured in millivolts (mV) and the horizontal eye openings can be measured in picoseconds (ps). Like the PAM4 eye 400, the PAM7 eye diagram 500 illustrates significant improvements in both vertical and horizontal measurements. For example, a worst case horizontal measurement can be at least an 8% improvement by increasing the horizontal measurement by around four picoseconds. Additionally, a worst case vertical measurement can be at least a 100% improvement. The improved PAM7 eye openings due to the reduced input swing can correspond to around a 2 picosecond or 8% tap delay reduction.

Regarding, FIG. 4 and FIG. 5, the PAM4 and PAM7 eye diagrams 400, 500 are exemplary, and it should be appreciated that the DAC cell with keeper based switch driver 100 and/or the DAC cell with dynamic keeper based switch driver 200 can be used for any PAM-N signal. Additionally, as eye openings get smaller with higher orders of N, the keeper based cell will be even more advantageous.

The keeper based switch driver 100 includes various advantages. Generally, the keeper based switch driver 100 can provide improved performance for low voltage, high speed designs with reduced power and area, which can be applied to any CMOS to CML interface (e.g., high speed TX-DACs). More specifically, the skewed inverter pre-drivers 115a, 115b with stronger PMOS can raise the crossing point without introducing additional delay, thereby generating overlapping differential signals. Additionally, the keeper cell 110 corresponds to an addition of a PMOS device following the switch. The keeper cell 110 can serve as a pull up device and further increases the crossing point, thereby enabling optimal biasing for the DAC cell. Further, the CMOS signal swing can be limited to |Vds| of the keeper cell 110. This lower swing reduces the delay and helps in faster switching with improved rise/fall times. Additional circuit advantages include PAM eyes (e.g., PAM4 and PAM7) with enhanced horizontal/vertical measurements for the eye openings, robust eye tolerance to supply variations, high frequency operation (e.g., 8% speed improvement), low voltage applications, minimum area penalty, and low power. Additional keeper based switch driver 100 system advantages can include reduced inter-symbol-interference (ISI), improved signal-to-noise ratio (SNR), and reduced bit-error rate (BER).

Having now described embodiments of the disclosed subject matter, it should be apparent to those skilled in the art that the foregoing is merely illustrative and not limiting, having been presented by way of example only. Thus, although particular configurations have been discussed herein, other configurations can also be employed. Numerous modifications and other embodiments (e.g., combinations, rearrangements, etc.) are enabled by the present disclosure and are within the scope of one of ordinary skill in the art and are contemplated as falling within the scope of the disclosed subject matter and any equivalents thereto. Features of the disclosed embodiments can be combined, rearranged, omitted, etc., within the scope of the invention to produce additional embodiments. Furthermore, certain features may sometimes be used to advantage without a corresponding use of other features. Accordingly, Applicant(s) intend(s) to embrace all such alternatives, modifications, equivalents, and variations that are within the spirit and scope of the disclosed subject matter.

The invention claimed is:
1. A keeper based switch driver, comprising:
   circuitry configured to
      generate overlapping differential signals,
      increase a crossing point of the overlapping differential signals a first predetermined amount,
      further increase the crossing point of the overlapping differential signals a second predetermined amount, and limit signal swing to an absolute value of a drain source voltage.

2. The keeper based switch driver of claim 1, wherein the crossing point of the overlapping differential signals is increased without introducing delay.

3. The keeper based switch driver of claim 1, wherein the crossing point of the overlapping differential signals is increased by the first predetermined amount based on a skewed inverter pre-driver configuration.

4. The keeper based switch driver of claim 3, wherein the skewed inverter pre-driver configuration includes a symmetrical pair of skewed inverter pre-drivers, a first skewed inverter pre-driver connected to a positive input terminal and a second skewed inverter pre-driver connected to a negative input terminal.

5. The keeper based switch driver of claim 4, wherein each of the first skewed inverter pre-driver and the second skewed inverter pre-driver includes an n-channel metal-oxide-semiconductor (NMOS) device connected to a p-channel metal-oxide-semiconductor (PMOS) device that is larger than the NMOS device.

6. The keeper based switch driver of claim 1, wherein the crossing point of the overlapping differential signals is further increased the second predetermined amount based on a keeper cell.

7. The keeper based switch driver of claim 6, wherein the keeper cell is configured as a pull up device.

8. The keeper based switch driver of claim 6, wherein the keeper cell is configured to have programmable current consumption.

9. The keeper based switch driver of claim 1, wherein the limited signal swing corresponds to the drain-source voltage of the devices in the keeper cell.

10. The keeper based switch driver of claim 1, wherein the circuitry is further configured to improve PAM-N eye quality, where N is an integer greater than one.

11. A system, comprising:
a keeper based switch driver including circuitry configured to
generate overlapping differential signals,
increase a crossing point of the overlapping differential signals a first predetermined amount,
further increase the crossing point of the overlapping differential signals a second predetermined amount, and
limit signal swing to an absolute value of a drain-source voltage; and
a microprocessor electrically connected to a performance detection circuit, the microprocessor including processing circuitry configured to
receive information from the performance detection circuit, and
control a current of a biasing circuit in the keeper based switch driver to control current consumption in at least part of the keeper based switch driver.

12. The system of claim 11, wherein the received information includes a circuit condition of at least one component of the keeper based switch driver.

13. The system of claim 12, wherein the circuit condition includes a temperature of at least one component of the keeper based switch driver.

14. The system of claim 11, wherein the crossing point of the overlapping differential signals is increased without introducing delay.

15. The system of claim 11, wherein the crossing point of the overlapping differential signals is increased the first predetermined amount based on a skewed inverter pre-driver configuration, the skewed inverter pre-driver configuration including a symmetrical pair of skewed inverter pre-drivers, a first skewed inverter pre-driver being connected to a positive input terminal and a second skewed inverter pre-driver being connected to a negative input terminal.

16. The system of claim 15, wherein each of the first skewed inverter pre-driver and the second skewed inverter pre-driver includes an n-channel metal-oxide-semiconductor (NMOS) device connected to a p-channel metal-oxide-semiconductor (PMOS) device that is larger than the NMOS device.

17. The system of claim 11, wherein the crossing point of the overlapping differential signals is further increased the second predetermined amount based on a keeper cell, the keeper cell being configured as a pull up device.

18. The system of claim 17, wherein the keeper cell is configured to have programmable current consumption.

19. The system of claim 11, wherein the limited signal swing corresponds to the drain-source voltage of the keeper cell.

20. The system of claim 11, wherein the circuitry is further configured to improve PAM-N eye quality, where N is an integer greater than one.

* * * * *